US008487660B2

(12) United States Patent
Floyd

(10) Patent No.: US 8,487,660 B2
(45) Date of Patent: Jul. 16, 2013

(54) TEMPERATURE-STABLE CMOS VOLTAGE REFERENCE CIRCUITS

(75) Inventor: Brian Harold Floyd, Sunnyvale, CA (US)

(73) Assignee: Aptus Power Semiconductor, Los Altos, CA (US)

( * ) Notice: Subject to any disclaimer, the term of this patent is extended or adjusted under 35 U.S.C. 154(b) by 118 days.

(21) Appl. No.: 13/277,188

(22) Filed: Oct. 19, 2011

(65) Prior Publication Data

US 2012/0092064 A1 Apr. 19, 2012

Related U.S. Application Data

(60) Provisional application No. 61/394,665, filed on Oct. 19, 2010.

(51) Int. Cl.
*H03K 5/153* (2006.01)

(52) U.S. Cl.
USPC ............... 327/72; 327/205; 327/83; 327/513; 327/138; 327/323; 327/512

(58) Field of Classification Search
USPC .............. 327/72, 205, 83, 513, 138, 323, 512
See application file for complete search history.

(56) References Cited

U.S. PATENT DOCUMENTS

| | | | | |
|---|---|---|---|---|
| 4,464,588 | A | 8/1984 | Wieser | |
| 4,837,459 | A | 6/1989 | Bukowski et al. | |
| 5,109,187 | A | 4/1992 | Guliani | |
| 5,420,798 | A | 5/1995 | Lin et al. | |
| 6,040,735 | A | 3/2000 | Park et al. | |
| 6,686,797 | B1 | 2/2004 | Eker | |
| 7,038,530 | B2 | 5/2006 | Chou | |
| 7,173,482 | B2 * | 2/2007 | Lobb et al. | 327/541 |
| 7,339,417 | B2 * | 3/2008 | Inoue | 327/543 |
| 7,808,068 | B2 * | 10/2010 | Hartley | 257/467 |
| 7,919,954 | B1 * | 4/2011 | Mannama et al. | 323/272 |
| 7,936,208 | B2 * | 5/2011 | Clements et al. | 327/543 |
| 7,973,593 | B2 * | 7/2011 | Kitamura | 327/539 |
| 7,994,848 | B2 | 8/2011 | Kothandaraman et al. | |
| 8,188,785 | B2 * | 5/2012 | Iacob et al. | 327/543 |
| 2006/0103455 | A1 * | 5/2006 | Zhang et al. | 327/543 |
| 2008/0150502 | A1 * | 6/2008 | Migliavacca | 323/281 |
| 2012/0092064 | A1 * | 4/2012 | Floyd | 327/543 |

* cited by examiner

*Primary Examiner* — Adam Houston
(74) *Attorney, Agent, or Firm* — Venture Pacific Law, PC

(57) ABSTRACT

A temperature stable comparator circuit, comprised of: a branch C having a first end, a second end, a first type-1 device and first type-2 device, wherein the first type-1 device and the first type-2 device are connected to a node O; a branch B having a first end, a second end, a second type-1 device, a second type-2 device, and a resistor; and a branch A having a first end, a second end, a third type-2 device and a current-control device; wherein the first ends of the branch A, branch B, and branch C are commonly connected, and the second ends of the branch B and branch C are commonly connected.

24 Claims, 16 Drawing Sheets

TEMPERATURE-STABLE CMOS VOLTAGE REFERENCE CIRCUITS

CROSS REFERENCE

This application claims priority from a provisional patent application entitled "A CMOS Temperature-Stable Voltage Reference" filed on Oct. 19, 2010 and having an Application No. 61/394,665. Said application is incorporated herein by reference.

FIELD OF INVENTION

The present invention relates to electronic circuits and, in particular, to CMOS (complementary metal oxide semiconductor) circuits for generating temperature stable voltage references and to CMOS circuits for generating temperature stable voltage comparators.

BACKGROUND

Voltage references are required to provide a substantially constant output voltage irrespective of changes in input voltage, output current, or temperature. Such references are used in many design applications, such as stable current references, multipliers, control circuits, portable meters, two-terminal references and process controllers, a comparator mode for causing a logic transition, and a servo mode for generating a fixed voltage reference.

Modern voltage references are generally based on either zener diodes or bandgap generated voltages. A disadvantage of conventional bandgap voltage reference circuits is that they comprise resistors of comparatively large value, which resistors should be matched in value with each other. Particularly in integrated circuit ("IC") processes, in which it is difficult or not possible to fabricate resistors which are accurate and have comparatively high resistance values, said disadvantage is a very significant factor.

The challenge in using CMOS circuit design for generating voltage references is minimizing area for cost reduction. This necessitates the use of purely CMOS components to obsolete area-consuming bipolar devices. Furthermore, in order to further reduce the cost of manufacturing, the circuit design must use standard N-channel and P-channel type CMOS transistors.

In electronic systems including power management systems, it becomes necessary to monitor the supply voltage and effect a decision based upon a comparison of the supply voltage level with respect to a fixed reference voltage. For instance, LDO power-management systems require voltage blocking, referred to as lockout, when the supply is less than the minimum sustainable operating voltage. Also, load-switch and charge-pump systems require a supply voltage-level detection to change the charge-pump voltage levels. Moreover, for system stability and predictable performance, the logic comparison must be predictable and stable over temperature variation. Finally, when these electronic systems are battery powered, minimizing quiescent current becomes paramount. Thus, CMOS becomes the integrated circuit process of choice.

The problem then is to derive a circuit using standard CMOS transistors, N-channel and P-channel type transistors, for monitoring supply voltage with respect to a fixed reference. As a result, it is desirable to provide circuits for this function with a minimum number of transistors and can operate in either of two modes: (1) comparator mode for detecting supply voltage as an independent variable compared to an inherent temperature-independent reference; and (2) servo mode for generating a fixed temperature-independent voltage reference.

SUMMARY OF INVENTION

An object of this invention is to provide IC circuits for generating a temperature stable voltage reference.

Another object of this invention is to provide IC circuits for generating a voltage reference having an area-efficient design with relatively few circuit branches and operating with relatively low quiescent current.

Yet another object of this invention is to provide IC circuits having at least two modes of operation, including a comparator mode to compare an independent voltage to an inherent voltage reference and a servo mode to generate a fixed temperature-stable voltage.

Briefly, the present invention discloses a temperature stable comparator circuit, comprised of: a branch C having a first end, a second end, a first type-1 device and first type-2 device, wherein the first type-1 device and the first type-2 device are connected to a node O; a branch B having a first end, a second end, a second type-1 device, a second type-2 device, and a resistor; and a branch A having a first end, a second end, a third type-2 device and a current-control device; wherein the first ends of the branch A, branch B, and branch C are commonly connected, and the second ends of the branch B and branch C are commonly connected; wherein the third type-2 device is diode-connected having a first terminal and a second terminal and having a VCT voltage across the first and second terminals, wherein the second terminal is connected to the first end of the branch A, and the first terminal is connected to the first type-2 device and the second type-2 device; wherein the second type-1 device is diode-connected and is connected to the first type-1 device; wherein the current in the branches are proportional to absolute temperature (PTAT); and wherein the current in branch A is proportional to the voltage VR.

An advantage of this invention is that IC circuits for generating a temperature stable voltage reference are provided.

Another advantage of this invention is that IC circuits for generating a voltage reference having an area-efficient design with relatively few circuit branches and operating with relatively low quiescent current are provided.

Yet another advantage of this invention is that IC circuits having at least two modes of operation, including a comparator mode to compare an independent voltage to an inherent voltage reference and a servo mode to generate a fixed temperature-stable voltage, are provided.

DESCRIPTION OF THE DRAWINGS

The foregoing and other objects, aspects, and advantages of the invention can be better understood from the following detailed description of the preferred embodiment of the invention when taken in conjunction with the accompanying drawings in which.

DETAILED DESCRIPTION OF THE PREFERRED EMBODIMENTS

The following circuit diagrams of the present invention, illustrated in the figures, can be understood by a person having ordinary skill in the art, e.g., an electrical engineer who designs integrated circuits using common-practiced techniques including hierarchical circuit design with schematic-entry tools. Integrated circuit techniques for properly biasing circuit junctions and methods for properly biasing CMOS body junctions, and permutations thereof, are also understood by a person having ordinary skill in the art. Thus, such commonly known techniques are incorporated. Furthermore, for purposes of clarity and brevity, like elements and components may bear the same designations and numbering throughout the figures. Moreover, N-type MOSFET (metal-oxide-semiconductor field-effect transistor) can be referred to as NMOS and P-type MOSFET (metal-oxide-semiconductor field-effect transistor) can be referred to as PMOS.

Figure 1:
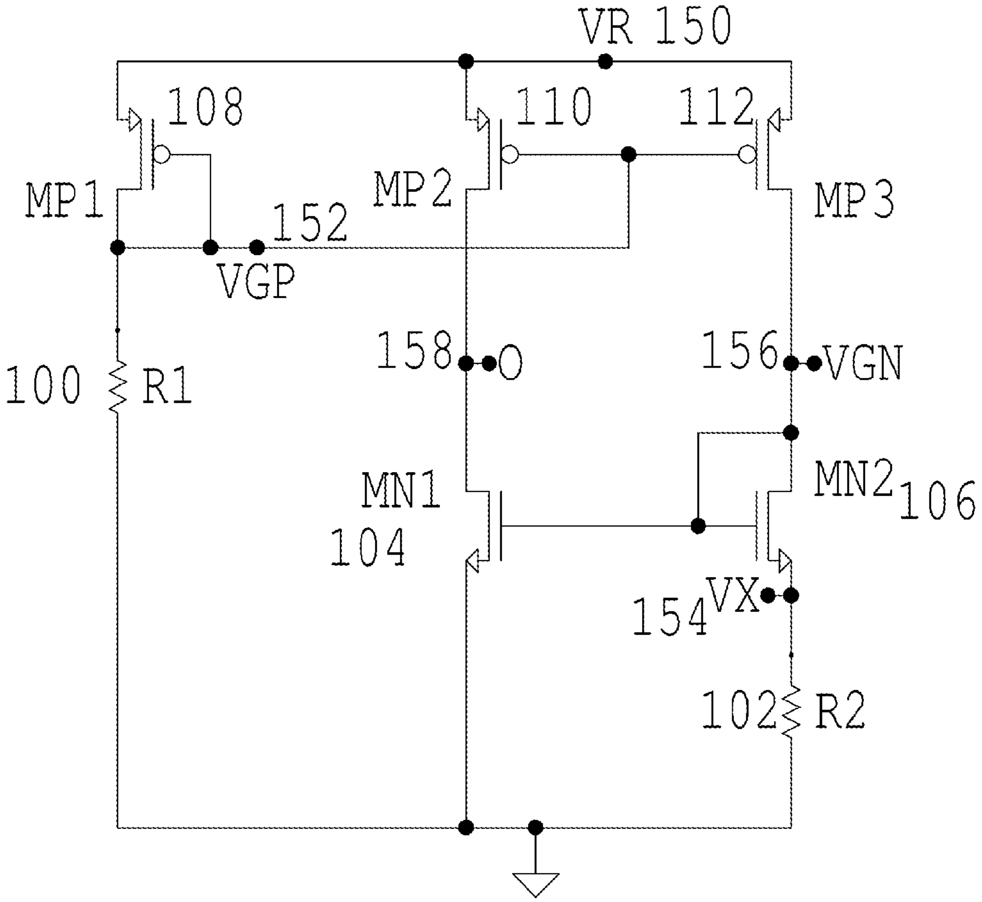
FIG. 1 illustrates a comparator mode CMOS circuit design of the present invention for generating an output voltage O that is a function of an input voltage, i.e., a voltage VR, and of temperature.

FIG. 1 illustrates a comparator mode CMOS circuit design of the present invention for generating an output voltage O 158 that is a function of an input voltage, i.e., a voltage VR 150, and of temperature. Resistor R1 100 connects to the drain of PMOS MP1 108 at a voltage node labeled VGP 152. The other end of resistor R1 100 connects to ground. The body and source of PMOS MP1 108 connect to the reference voltage VR 150. The gate and drain of MP1 108 are connected together at voltage node VGP 152. PMOS MP2 110 and MP3 112 are matched to PMOS MP1 108. The gate of PMOS MP2 110 and the gate of PMOS MP3 112 both connect to the gate of PMOS MP1 108 at the voltage node VGP 152.

As evident to a circuit designer having ordinary skill in the art, there are many degrees of freedom for selecting the relationship between the scaling sizes of PMOS MP1 108, PMOS MP2 110, and PMOS MP3 112. In a preferred configuration, PMOS MP2 110 and PMOS MP3 112 can be selected to be of equal size and to allow the size of PMOS MP1 108 to be an integer multiple N, e.g., a value of 2, times the size of PMOS MP2 110 and PMOS MP3 112. The multiplication factor N can also be a fixed value by design.

The drain of PMOS MP2 110 connects directly to the drain of NMOS MN1 104 to create the voltage node O 158. The drain of PMOS MP3 112 connects directly to the drain of NMOS MN2 106 at the voltage node VGN 156. Note that VGN can also be referred to as VG. The gates of NMOS MN1 104 and NMOS MN2 106 connect together at the voltage node VGN 156. NMOS MN1 104 and NMOS MN2 106 are matched to have a predictable voltage at voltage node VX 154.

While a circuit designer having ordinary skill in the art would recognize infinite permutations for relating the size of NMOS MN1 104 to the size of NMOS MN2 106, a preferred design choice would be to select the size of NMOS MN2 106 to be larger than NMOS MN1 104 by an integer scale factor M, e.g., a value of 4. The source and body of NMOS MN1 104 connect to ground. The source of NMOS MN2 106 connects to resistor R2 102 at a voltage node labeled VX 154. The other end of resistor R2 102 connects to ground. The body of NMOS MN2 106 connects to ground. If isolated NMOS devices are available, the body of NMOS MN2 106 can be connected to its source at voltage node VX 154.

For optimum results, NMOS MN1 104 and NMOS MN2 106 should be designed for operation in the sub-threshold region. The circuit designer having ordinary skill in the art can understand this to require the devices to be sized for operation at or below the sub-threshold knee.

This circuit configuration may be referred to as comparator mode and is well suited for providing an output voltage O 158 which depends upon the applied voltage at VR 150. The trip or transition voltage at VR 150 is determined by a balance condition in which the drain current of PMOS MP2 110 equals the drain current of NMOS MN1 104. By design, when the voltage VR 150 reaches the trip voltage, the drain current of PMOS MP2 110 is a scaled multiple of PMOS MP1 108's drain current, which, in turn, is calculated by dividing the voltage VGP 152 by the resistance of R1 100. A circuit designer can select the scale factor between PMOS MP1 108 and PMOS MP2 110. For instance, one option could be to choose PMOS MP1 108 to be twice the size of PMOS MP2 110 so that the width to length ratio of PMOS MP1 108 is twice that of PMOS MP2 110. In this way, the drain current in PMOS MP2 110, at the balance (trip point) condition, would be one half the drain current in MP1 108.

Also, at the balance (trip point) condition, the drain currents in both PMOS MP2 110 and PMOS MP3 112 are a scaled multiple of the drain current in PMOS MP1 108. While it is not necessary, both PMOS MP2 110 and PMOS MP3 112 can be designed to be of equal size, e.g., have the same width-to-length ratio. For instance, if the width-to-length ratio of PMOS MP1 108 is chosen to be twice that of PMOS MP2 110, while the width-to-length ratios of both PMOS MP2 110 and PMOS MP3 112 are equal, then the currents in PMOS MP2 110 and PMOS MP3 112 are both equal to one-half the current in PMOS MP1 108 at the trip point. It can be appreciated that the scale ratios between PMOS MP1 108, PMOS MP2 110, and PMOS MP3 112 represent a design degree-of-freedom. Thus, numerous matching or scaling permutations for such design can be selected.

The drain current in NMOS MN1 104, at the balance trip point condition, is by design a scaled multiple of the voltage VX 154 divided by the resistance of R2 102. Also, at the trip point, the voltage VX 154 is given by the gate-source voltage of MN1 104 minus the gate-source voltage of MN2 106. Under the balanced condition, the physics of operation of both NMOS MN1 104 and NMOS MN2 106, is by design, predictable. A good choice of design is to have NMOS MN1 104 and NMOS MN2 106 operate in the sub-threshold region so that the voltage VX 154 takes on a PTAT (proportional-to-absolute-temperature) behavior.

In deriving the voltage VX 154, the gate-source voltage of NMOS MN2 106 must be less than the gate-source voltage of NMOS MN1 104. This is possible only if the drain current-density in NMOS MN2 106 is, by design, less than the current-density in NMOS MN1 104.

A circuit designer having ordinary skill in the art can recognize that if PMOS MP2 110 and PMOS MP3 112 have been selected to be of equal scale, then by design, NMOS MN2 106 must be scaled larger than NMOS MN1 104. As this scaling ratio also represents a design degree-of-freedom, one simple choice is to take NMOS MN2 106 to be four times that of NMOS MN1 104.

In all cases presented thus far, the meaning of scaling and matching should be common knowledge to an IC design engineer familiar with matching and scaling CMOS devices. Once the designer has selected the scale factors and sizing of the individual MOS devices for issues such as common-mode range and desired mode of operation, e.g., sub-threshold operation, the values of resistors R1 100 and R2 102 become the final degrees of freedom. These values in combination with the CMOS sizing constraints will determine the balance or trip-point condition as a function of the voltage VR 150.

An additional design consideration is temperature sensitivity. A relationship may be derived for the voltage VR 150 at the balance condition with temperature dependent terms. Since the current in PMOS MP1 108 increases with temperature, when the voltage VX 154 is PTAT and the current through NMOS MN1 104 increases with temperature, a temperature independent relationship may be derived. The mathematical relationship is found by setting the derivative of voltage VR 150, with respect to temperature, equal to zero. In this way resistor R1 100, resistor R2 102, or a combination of resistors R1 100 and R2 102 can be adjusted to cause the trip point at voltage VR 150 to have reduced temperature sensitivity.

Simulation is a valuable circuit tool for selecting appropriate values of resistor R1 100 and resistor R2 102 for deriving this temperature-stable trip point. When the voltage at VR 150 is less than the trip point value, the output voltage O 158 is logic high. When the voltage at the output voltage VR 150 is above the trip point value, the output voltage O 158 takes on a logic low. In order to improve the gain of the transition at output voltage O 158, a buffer may be used as illustrated in FIG. 2.

Figure 2:
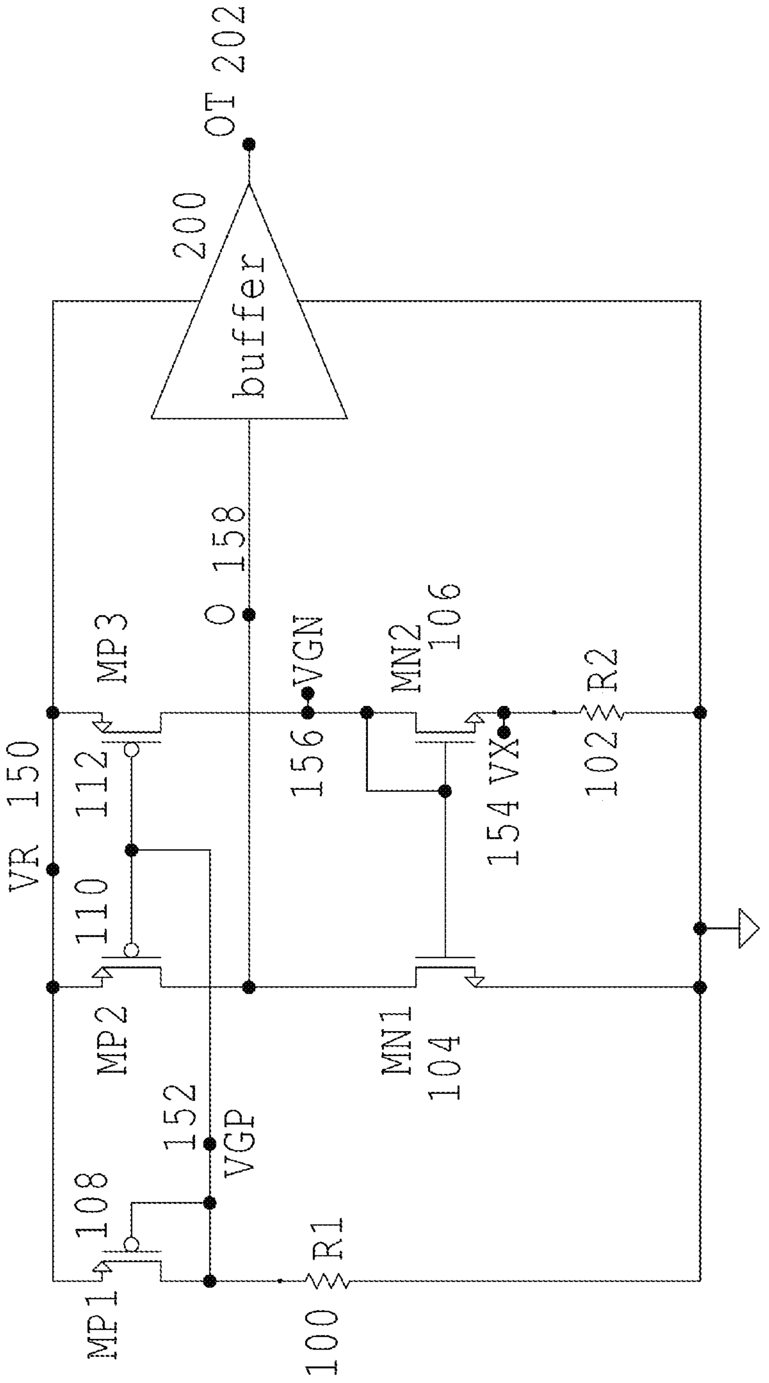
FIG. 2 illustrates a comparator mode circuit diagram of the present invention for generating an output voltage O, having a buffer stage connected between the output voltage O and a buffered output OT.

FIG. 2 illustrates a comparator mode circuit diagram of the present invention for generating an output voltage O, having a buffer stage connected between the output voltage O 158 and a buffered output OT 202. This comparator mode circuit diagram augments the circuit illustrated in FIG. 1 by including a buffer stage 200 between the voltage node O 158 and the buffered-output voltage OT 202. The buffer stage 200 represents an amplification or gain stage with connection between supply voltage VR 150 and connection to ground. Also, as a design option, hysteresis is added to the buffer stage 200 with a positive feedback network.

Figure 3:
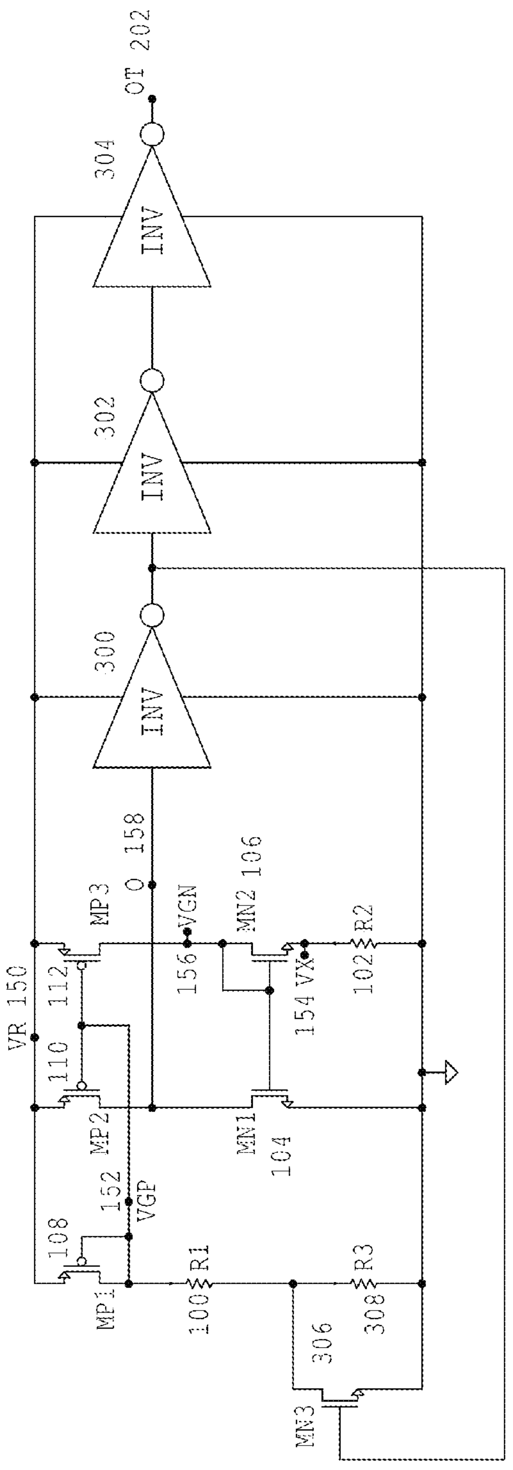
FIG. 3 illustrates a comparator mode circuit diagram of the present invention that includes three inverter stages between voltage O and the buffered output OT and a positive feedback loop for creating hysteresis.

FIG. 3 illustrates a comparator mode circuit diagram of the present invention that includes three inverter stages between voltage O 158 and the buffered output OT 202 and a positive feedback loop for creating hysteresis. This comparator mode circuit diagram augments the circuit illustrated in FIG. 1 by including an inverter stage and positive feedback. Buffering can be realized by including three inverters, denoted INV 300, INV 302, and INV 304, and positive feedback to allow for hysteresis. The inverters INV 300, INV 302, and INV 304 transition between the reference voltage VR 150 and ground. The input of INV 300 is voltage O 158. The output of INV 300 connects to the input of INV 302. The output of INV 302 then connects to the input of INV 304. These inverters provide the buffered output OT 202.

For positive feedback, resistor R1 100 is connected between the drain of PMOS MP1 108 and an additional resistor R3 308. Resistor R3 308 is typically designed to be a smaller fraction of the net resistance of resistor R1 100 and resistor R3 308. Thus, this configuration has a positive feedback with NMOS MN3 306.

The other end of resistor R3 308 connects to ground. NMOS MN3 306 operates as a switch with its drain connected to one end of resistor R3 308 and with body-connected source connected to ground. The gate of NMOS MN3 306 connects to the output of inverter 300. In this way, the trip point when the voltage at VR 150 increases will be higher than the trip point when the voltage at VR 150 decreases.

Figure 4:
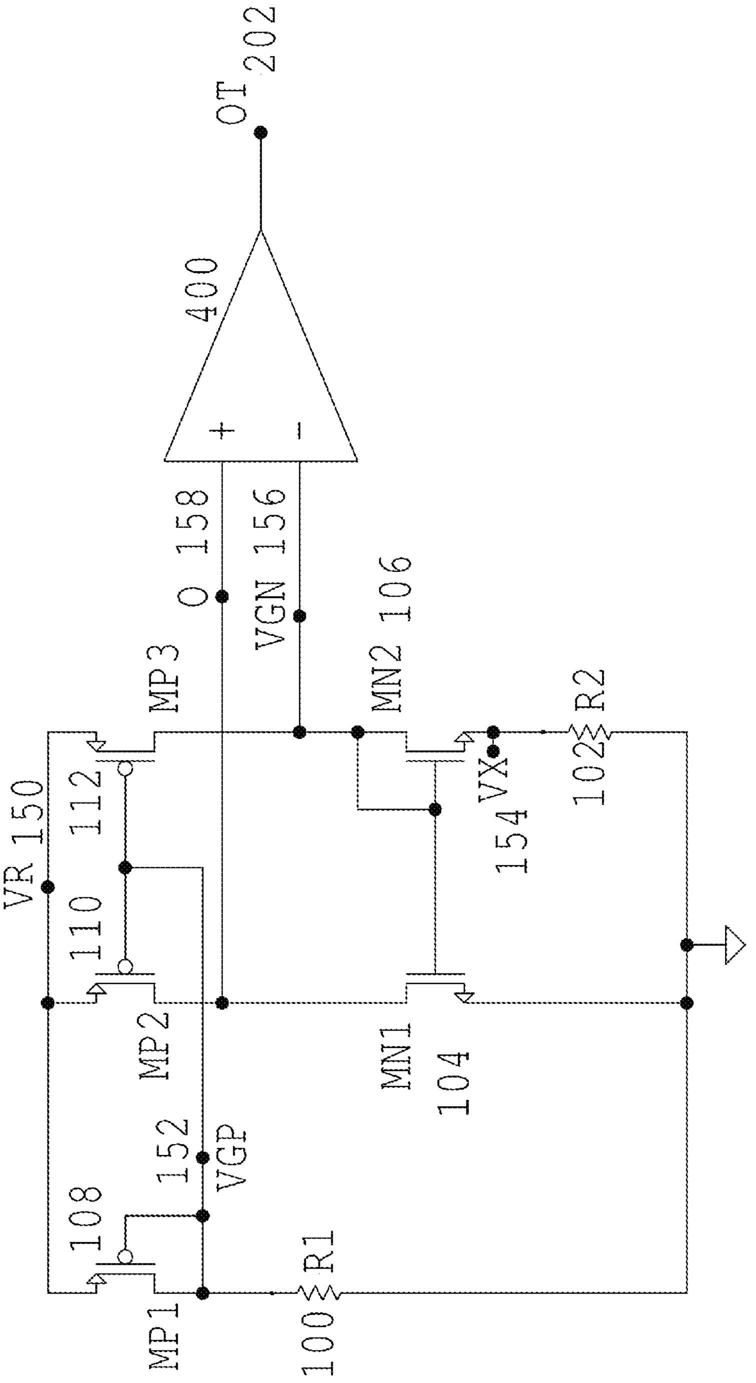
FIG. 4 illustrates a comparator mode circuit diagram of the present invention that includes a generic gain stage with inputs O and VGN and outputs voltage OT.

FIG. 4 illustrates a comparator mode circuit diagram of the present invention that includes a generic gain stage with inputs O 158 and VGN 156 and outputs voltage OT 202. In this circuit embodiment, a differential gain stage (or comparator) is connected between the voltage O 158 and the buffered output OT 202 of the circuit diagram illustrated in FIG. 1. The inputs to the differential gain stage are voltage nodes O 158 and VGN 156. Thus, a differential buffer COMP 400 can be used to create the buffered output OT 202; this buffer COMP 400 serves the same purpose as in FIG. 2. Referring to FIG. 4, as the voltage VR 150 reaches the trip point (balance condition) the buffered output OT 202 changes logic state based upon the relationship between the output voltage O 158 and the voltage VGN 156. In an embodiment of the present invention, a differential comparator can be used to implement the buffer. Alternatively, if the comparator COMP 400 is replaced with an amplifier, the system may be put into a closed loop feedback arrangement as shown in FIG. 5.

Figure 5:
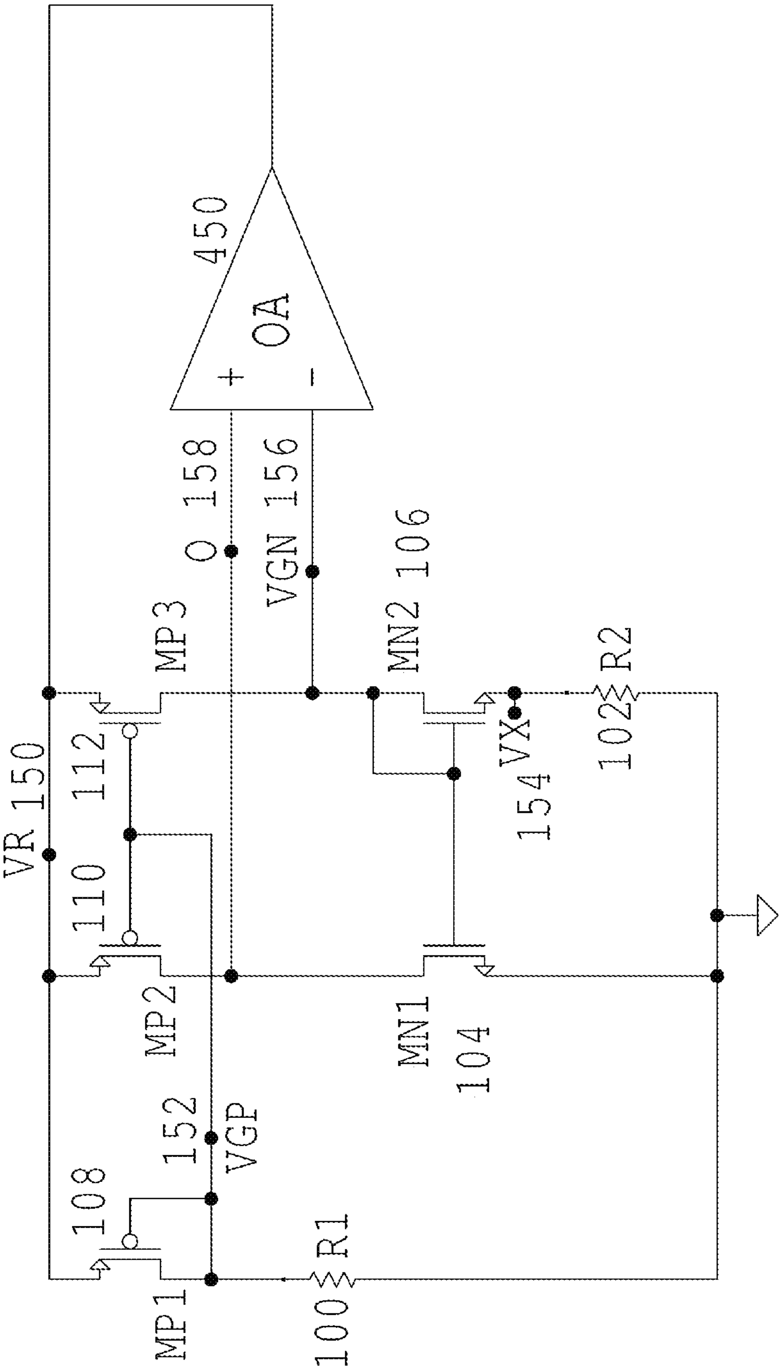
FIG. 5 illustrates a servo mode circuit diagram of the present invention for generating a fixed reference VR using feedback from an amplifier.

FIG. 5 illustrates a servo mode circuit diagram of the present invention for generating a fixed reference VR using feedback from an amplifier. A servo mode is an extension of the concept illustrated in FIG. 4 by creating a feedback-loop to the reference node VR 150. In this feedback-loop, amplifier OA 450 is connected in a negative feedback arrangement.

This is accomplished with the positive input to amplifier OA 450 attached to voltage node O 158 and the negative input attached to voltage node VGN 156. The output of amplifier OA 450 then drives the reference node VR 150 forming a closed-loop system. This feedback arrangement can be referred to as a servo mode. In servo mode, voltage VR 150 is the output, and the inputs are voltages O 158 and VGN 156. Thus, a stable negative-feedback system is formed such that the output of OA 450 regulates voltage VR 150 to a stable value.

In theory, the stable value should be equivalent to the trip point (i.e., balanced condition) described in the discussion of FIG. 1. Based on prior discussion for designing a temperature-stable trip-point for voltage VR 150, the same design procedure can be used to cause voltage VR 150 to form a stable temperature-stable reference. In servo mode, either resistor R1 100 or R2 102 can be trimmed, i.e., adjusted, to fix the reference to a desired value.

The circuit design illustrated in FIG. 4 and FIG. 5 may also be combined to trim the trip point (balance condition) of FIG. 4 to a desired value. For instance, if the buffer of FIG. 4 is designed so that it may operate temporarily in the closed loop (servo-mode) configuration of FIG. 5, then voltage VR 150 may be trimmed to a desired value.

Referring to FIG. 5, in order to accomplish this, the buffer must be temporarily stabilized to become an amplifier OA 450 with its output temporarily connected to VR 150. Upon trimming to the desired target voltage VR 150, the output of the OA 450 can then be disconnected from voltage VR 150 to recover the comparator mode circuit illustrated in FIG. 4. A circuit designer having ordinary skill in the art can recognize these operations may be performed with logic-controlled transmission gates and a basic operational amplifier temporarily compensated with an output capacitor.

Figure 6:
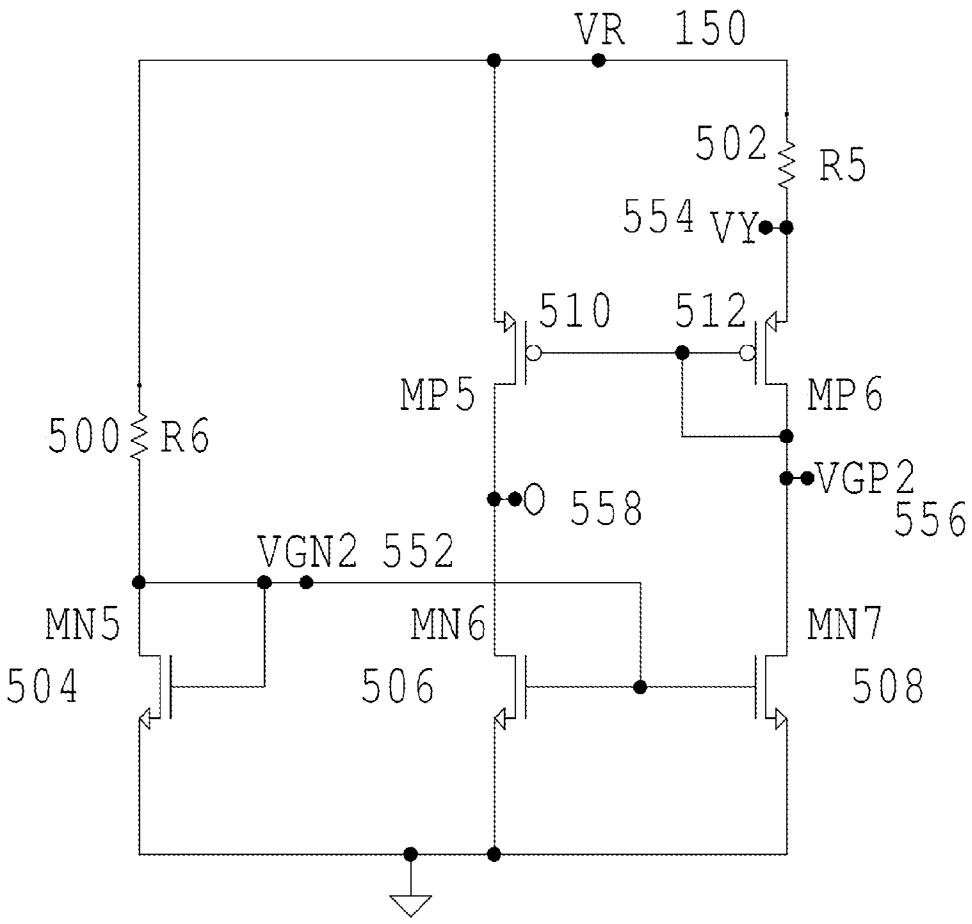
FIG. 6 illustrates an alternative embodiment for a comparator mode circuit diagram of the present invention for generating an output voltage O that is a function of an input voltage VR and of temperature.

FIG. 6 illustrates an alternative embodiment of a comparator mode circuit diagram of the present invention for generating an output voltage O 158 that is a function of an input voltage VR 150 and of temperature. The circuit diagram illustrated in FIG. 6 is a dual analogous embodiment to the circuit diagram illustrated in FIG. 1 in which the functions of the PMOS and NMOS devices have been reversed. Referring to FIG. 6, resistor R6 500 connects to the drain of NMOS MN5 504 at the voltage node labeled VGN2 552. The other end of resistor R6 500 connects to voltage VR 150. The body and source of NMOS MN5 504 connect to ground. The gate and drain of MN5 504 are connected together at voltage node VGN2 552. NMOS MN6 506 and NMOS MN7 508 are matched to NMOS MN5 504. The gate of NMOS MN6 506 and the gate of NMOS MN7 508 both connect to the gate of NMOS MN5 504 at voltage node VGN2 552.

As evident to a circuit designer having ordinary skill in the art, there are many degrees of freedom for selecting the relationship between the scaling sizes of NMOS MN5 504, NMOS MN6 506, and NMOS MN7 508. In a preferred configuration, NMOS MN6 506 and MN7 508 can be of equal size. Furthermore, the size of NMOS MN5 504 can be an integer multiple N, e.g., a value of 2, times the size of NMOS MN6 506 and NMOS MN7 508. The multiplication factor N can then be fixed by design.

The drain of NMOS MN6 506 connects directly to the drain of PMOS MP5 510 to create the voltage node output O 558. The drain of NMOS MN7 508 connects directly to the drain of PMOS MP6 512 at the voltage node VGP2 556. The gates of PMOS MP5 510 and PMOS MP6 512 connect together at the voltage node VGP2 556. PMOS MP5 510 and PMOS MP6 512 are matched so as to form a predictable voltage at voltage node VY 554.

While there are many permutations for relating the size of PMOS MP5 510 to the size of PMOS MP6 512, a preferred configuration can be to select the size of PMOS MP6 512 to be larger than PMOS MP5 510 by an integer scale factor M, e.g., a value of 4. The source and body of PMOS MP5 510 connect to voltage VR 150. The source of PMOS MP6 512 connects to resistor R5 502 at voltage node labeled VY 554. The other end of resistor R5 502 connects to VR 150. The body of PMOS MP6 512 connects to voltage node VR 150. The body of PMOS MP6 512 can be connected to its source at voltage node VY 554 by isolating the PMOS devices. For optimum results, PMOS MP5 510 and PMOS MP6 512 should be designed for operation in the sub-threshold region. It can be understood this requires the devices to be sized for operation at or below the sub-threshold knee.

This complementary approach to the circuit of FIG. 1 is also well suited for operating in comparator mode. The design approach, theory, and behavior relating output O 558 to the applied voltage at VR 150 are analogous to the approach, theory, and behavior described for FIG. 1. Referring to FIG. 6, there is a complementary balance condition, where the drain current of NMOS MN6 506 equals the drain current of PMOS MP5 510. The design of transistors NMOS MN5 504, NMOS MN6 506, and NMOS MN7 508 follow the same procedure as transistors PMOS MP1 108, PMOS MP2 110, and PMOS MP3 112 of the circuit diagram illustrated in FIG. 1. Also, the transistors PMOS MP5 510 and PMOS MP6 512 are designed so as to set up a predictable voltage VY 554 in the same manner as transistors MN1 104 and MN2 106 set up a predictable voltage VX 154 for the circuit diagram illustrated in FIG. 1. Resistors R6 500 and R5 502 are also analogous to resistors R1 100 and R2 102 of the circuit diagram illustrated in FIG. 1.

Figure 7:
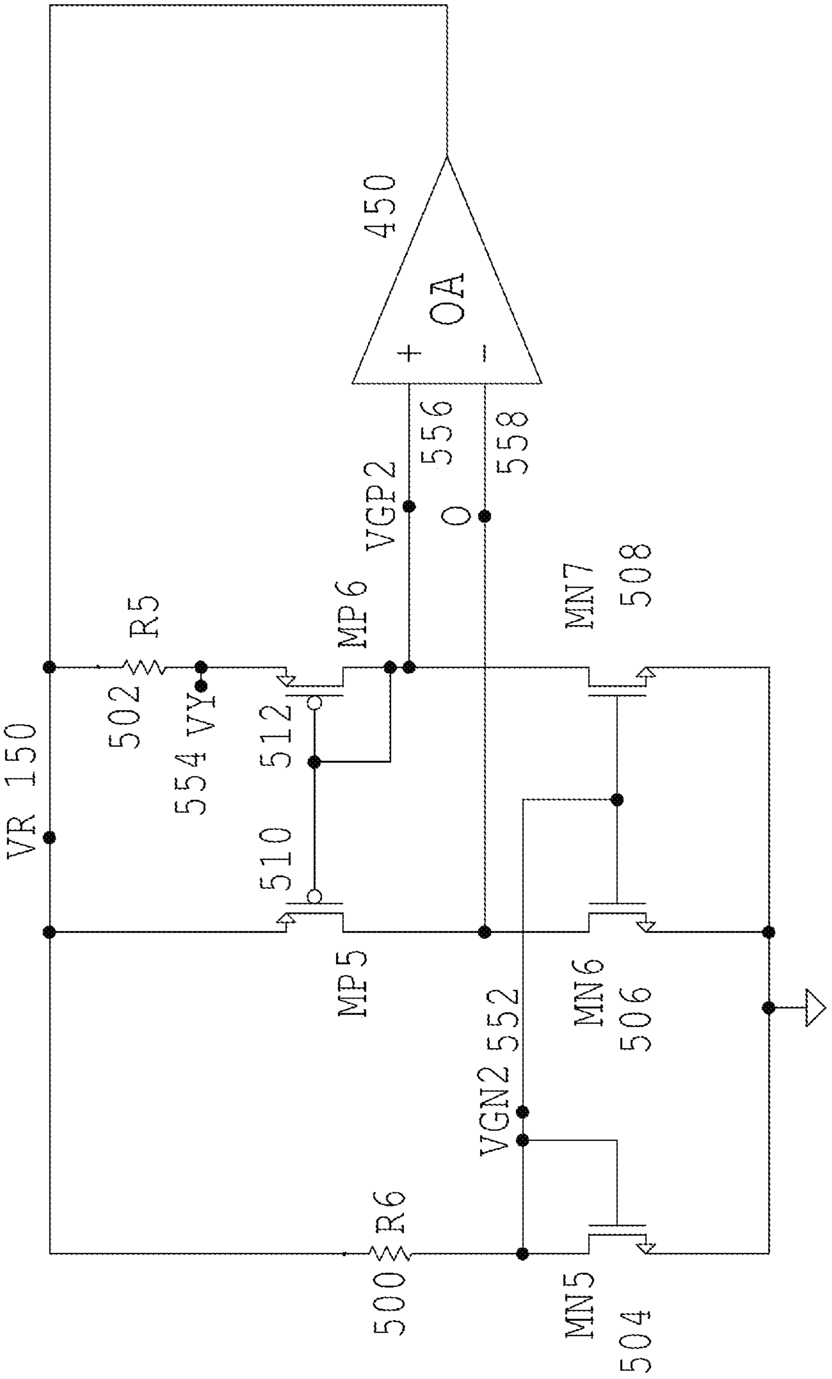
FIG. 7 illustrates an alternative embodiment for a servo mode circuit diagram of the present invention using feedback to generate a fixed reference VR.

FIG. 7 illustrates an alternative embodiment for a servo mode circuit diagram of the present invention using feedback to generate a fixed reference VR. Here, the circuit diagram illustrated in FIG. 6 is augmented by including a feedback loop to control the reference node VR 150. In this servo mode feedback-loop embodiment, amplifier OA 450 is connected in a negative feedback arrangement. This is accomplished with the negative input to amplifier OA 450 attached to voltage node output O 558 and the positive input attached to voltage node VGP2 556. The output of OA 450 then controls the reference node VR 150. This schematic is complementary by design to the circuit diagram illustrated in FIG. 5. In analogy, resistor R6 500 or R5 502 can be trimmed to fix voltage VR 150 to a desired temperature stable value.

Figure 8:
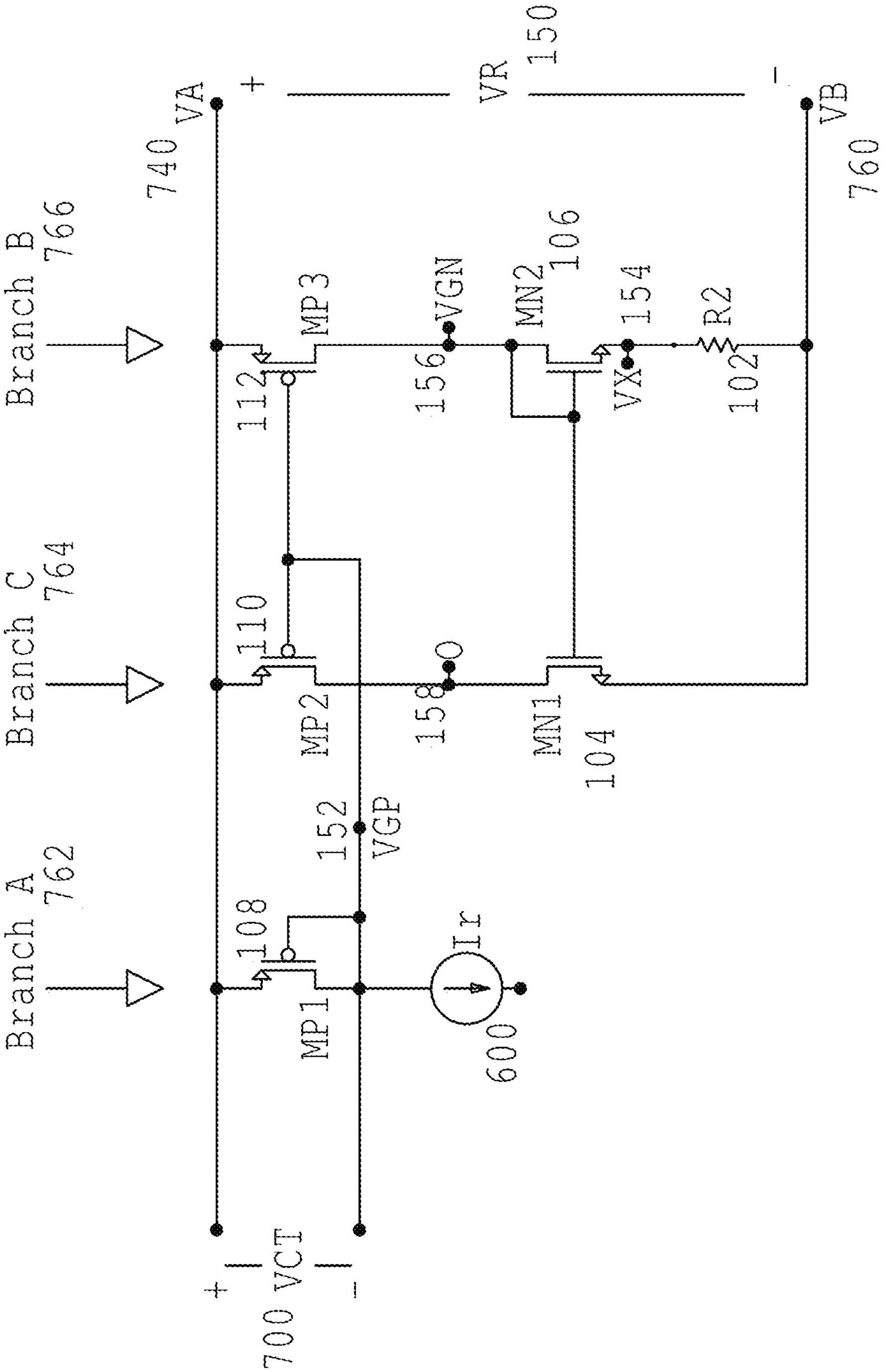
FIG. 8 illustrates a comparator mode circuit diagram of the present invention showing a generalized circuit derivation of the present invention in terms of circuit branches, including branch A, branch B, and branch C, with branch-node voltages VA and VB.

FIG. 8 illustrates a comparator mode circuit diagram of the present invention showing a generalized circuit derivation of the present invention in terms of circuit branches, including branch A 762, branch B 766, and branch C 764, with branch-node voltages VA 740 and VB 760. This is a more generalized embodiment of FIG. 1 by replacing the resistor R1 100 with a current source of value Ir 600. Circuit branch C 764 is the comparison branch with logic output O 158. Circuit branch B 766 is a parallel circuit branch which generates the gate voltage VGN 156. Here, voltage VGN 156 supplies a gate voltage to one device of the comparison branch. Circuit branch A 762 has a diode-connected CMOS device which generates the CTAT (complementary to absolute temperature) voltage level VCT 700.

In addition, the current through branch A 762 is proportional to VR 150. Voltage VCT 700 supplies gate voltage to the remaining device in the comparison branch. Branches C 764 and B 766 are by design in parallel with general endpoint node voltages labeled VA 740 and VB 760. The difference between voltages VA 740 and VB 760 is the branch differential voltage VR 150.

This general structure reduces to that of FIG. 1 when the current Ir 600 is generated from a resistor. The resistor is one simple approach to obtaining the desired proportional-to-VR 150 branch current while simultaneously satisfying the requirement that all branch currents are PTAT (proportional to absolute temperature). Many techniques exist in which to create a current source suitable for use in the concept of FIG. 1.

Figure 9:
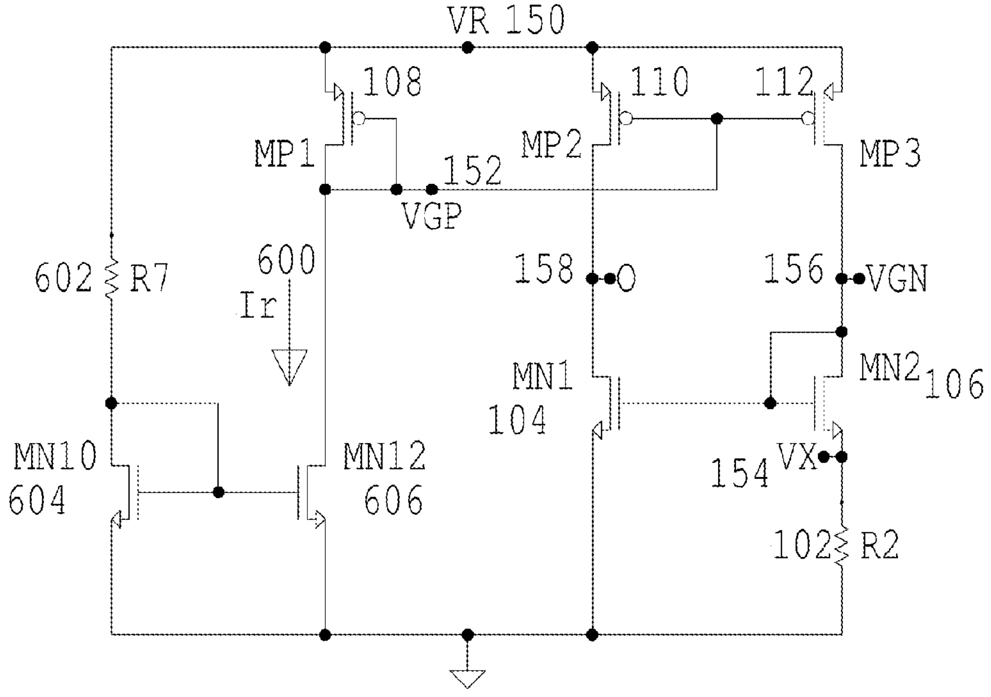
FIG. 9 illustrates an alternative embodiment for a comparator mode circuit diagram of the present invention that includes an alternative implementation for realizing the current Ir.

FIG. 9 illustrates an alternative embodiment for a comparator mode circuit diagram of the present invention that includes an alternative implementation for realizing the current Ir of FIG. 8. A current Ir 600 is the drain current of NMOS MN12 606. The drain current in NMOS MN12 606 is the mirror or scaled replica of the drain current in MN10 604. The drain current in NMOS MN10 604 is determined from the net voltage across resistor R7 602 and will give a similar behavior as that derived for FIG. 1.

Figure 10:
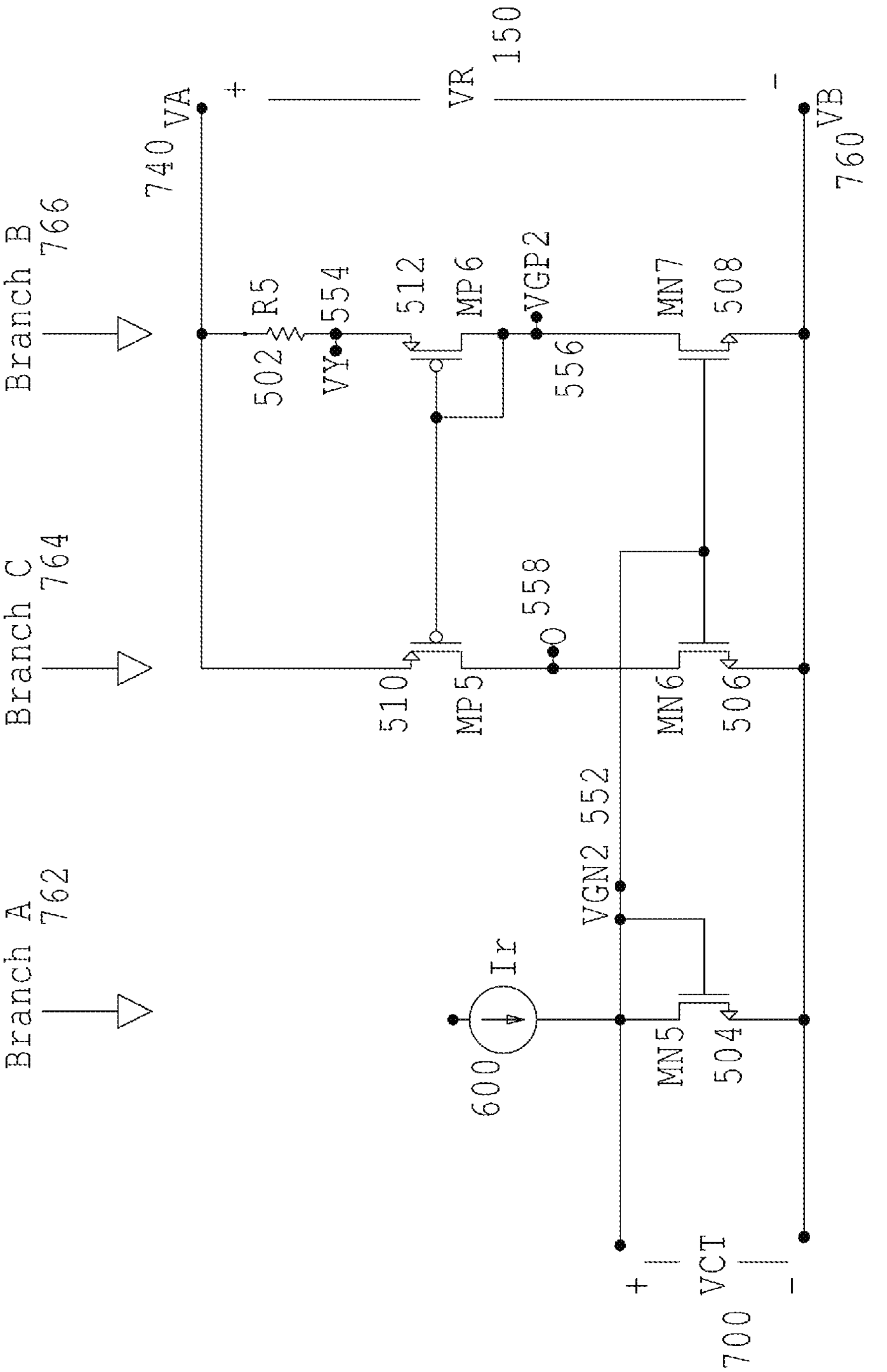
FIG. 10 illustrates an alternative embodiment for a comparator mode circuit diagram of the present invention using a generalized circuit derivation of the present invention in terms of circuit branches A, B, and C, and branch node voltages VA and VB.

FIG. 10 illustrates an alternative embodiment for a comparator mode circuit diagram of the present invention using a generalized circuit derivation of the present invention in terms of circuit branches branch A 762, branch B 766, and branch C 764, and branch node voltage VA 740 and VB 760. This is a more generalized embodiment of FIG. 6 by replacing resistor R6 500 in FIG. 6 with a current source of value Ir 600 in FIG. 10. Circuit branch C 764 is the comparison branch with logic output O 158. Circuit branch B 766 is a parallel circuit branch which generates the gate voltage VGP2 556. Voltage VGP2 556 supplies the gate voltage to one device of the comparison branch. Circuit branch A 762 has a diode-connected CMOS device which generates the CTAT (complementary to absolute temperature) voltage level as VCT 700.

In addition, the current through branch A 762 is proportional to voltage VR 150. Voltage VCT 700 supplies a gate voltage to the remaining device in the comparison branch. Branches C 764 and B 766 are in parallel with general endpoint node voltages labeled VA 740 and VB 760. The difference in value between voltages VA 740 and VB 760 is the branch differential voltage VR 150. This general structure reduces to that of FIG. 6 when the current Ir 600 is generated from a resistor. The resistor is one simple approach to obtaining the desired proportional-to-VR 150 branch current while simultaneously satisfying the requirement that all branch currents are (PTAT) proportional to absolute temperature. It can be appreciated that other techniques can also be used to implement a current source in accordance with the circuit diagram of the present invention.

Figure 11:
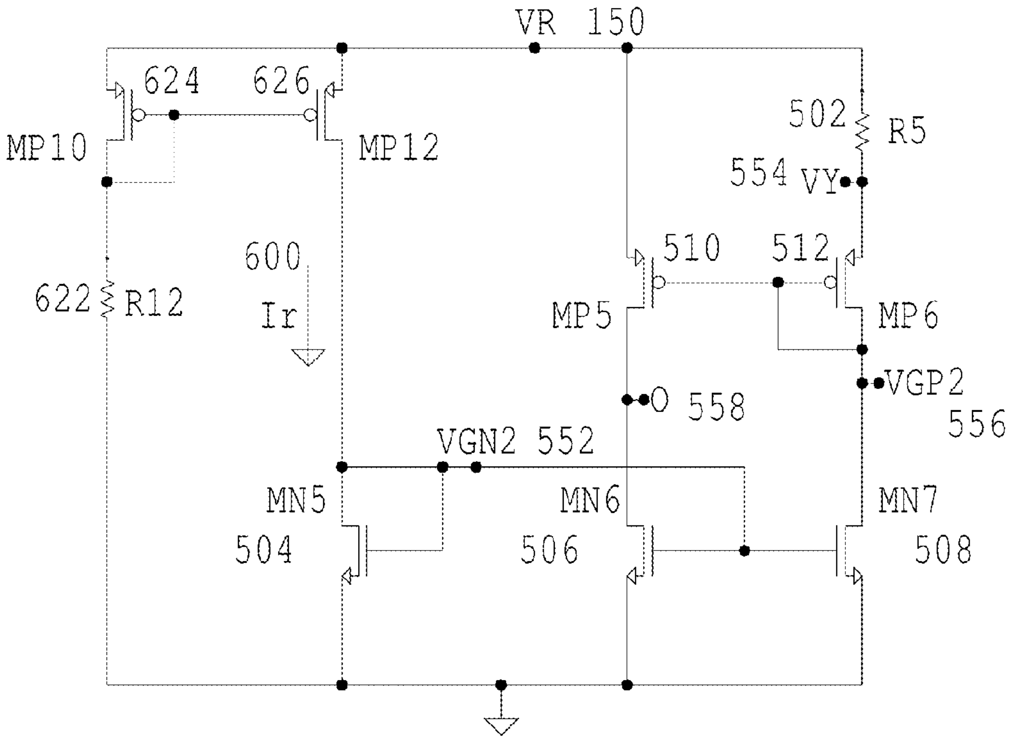
FIG. 11 illustrates yet another embodiment for a comparator mode circuit diagram of the present invention that includes an alternative implementation for realizing the current Ir.

FIG. 11 illustrates yet another embodiment for a comparator mode circuit diagram of the present invention that includes an alternative implementation for realizing the current Ir. Here, a mirrored or scaled current Ir 600 is created with resistor R12 622 and PMOS MP10 624. The replica or scaled value of the drain current in PMOS MP10 624 appears as Ir in the drain current of PMOS MP12 626.

Figure 12:
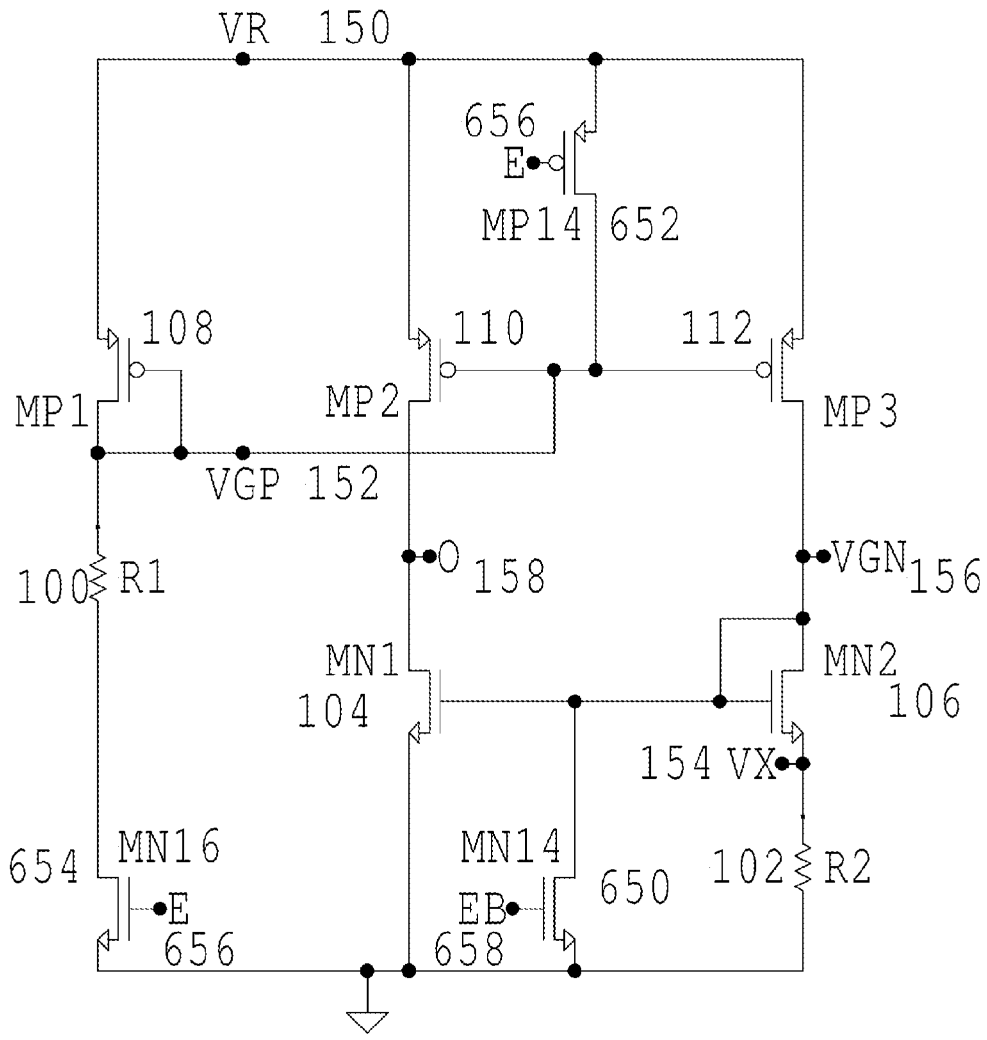
FIG. 12 illustrates a comparator mode circuit diagram of the present invention including additional circuit elements for a low-quiescent shutdown mode.

FIG. 12 illustrates a comparator mode circuit diagram of the present invention including additional circuit elements for a low-quiescent shutdown mode. The circuit diagram is an alternative embodiment of the circuit diagram illustrated in FIG. 1. However, the circuit diagram of FIG. 12 comprises additional transistors and modifications for reducing the quiescent current when the system receives a disable logic signal.

Referring to FIG. 12, NMOS MN16 654 acts as a switch which connects resistor R1 100 to ground when the system receives an enable high signal enable E 656. NMOS MN14 650 is switched on when the system is disabled with signal EB 658 (bar) and is switched off when the system is enabled. This can serve to guarantee both NMOS MN1 104 and NMOS MN2 106 remain off when the system is disabled. PMOS MP14 652 serves a similar purpose and will guarantee that PMOS MP1 108, PMOS MP2 110, and PMOS MP3 112 are off when the system is disabled. In this derivation, logic enable E 656 and its inverted logic value EB 658 (bar) are logic signals. The logic enable E 656 is high when the system is enabled.

Figure 13:
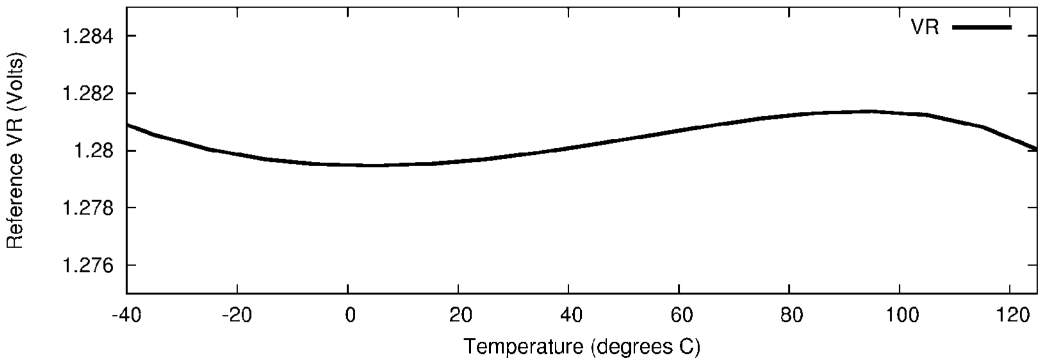
FIG. 13 illustrates a graphical representation of simulation results for a comparator mode circuit of the present invention, where the value of the voltage-reference VR versus temperature is plotted.

FIG. 13 illustrates a graphical representation of simulation results for a comparator mode circuit of the present invention for voltage-reference VR versus temperature. The simulated voltage-reference VR 150 behavior versus temperature is based upon the circuit diagram illustrated in FIG. 5. In simulating this circuit, the fixed design values were as follows: resistor R2 102 equals 250e3 ohms; PMOS MP1 108 width equals 12 microns; PMOS MP2 110 width equals 8 microns; PMOS MP3 112 width equals 8 microns; NMOS MN1 104 width equals 40 microns; NMOS MN2 106 width equals 160 microns; the PMOS transistors MP1 108, MP2 110, and MP3 112 have equal length of 6 microns; and the NMOS transistors both have a length of 0.5 microns.

For simulation, amplifier OA 450 is a behavioral VCVS (voltage controlled voltage source) with a gain of 50. The resistor R1 100 is adjusted until the voltage VR 150 versus temperature curve is stable, as shown in FIG. 13. The final value of resistor R1 100 is 1.8e6 ohms. The simulation models were based on a typical 0.35 micron CMOS process. FIG. 13 illustrates the simulations result of a temperature stable reference VR 150 bounded between 1.2814V and 1.2794V over a temperature range from −40 to 120 degrees C.

Figure 14:
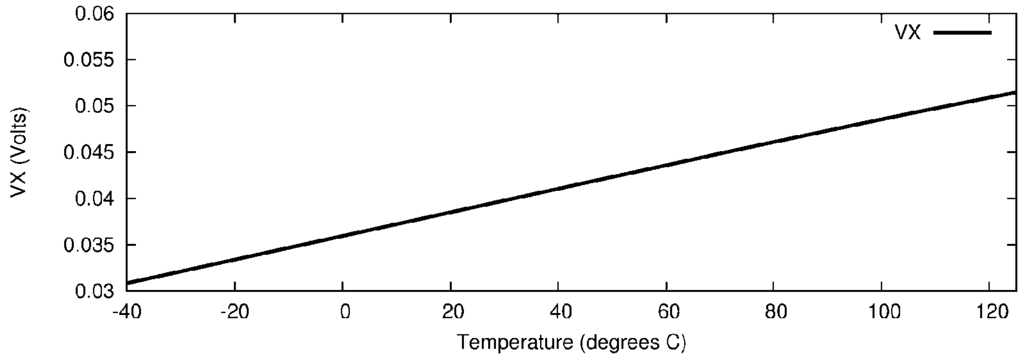
FIG. 14 illustrates a graphical representation of simulation results for a comparator mode circuit of the present invention, where the value of the voltage VX PTAT versus temperature is plotted.

FIG. 14 illustrates a graphical representation of simulation results of a voltage VX PTAT behavior versus temperature. Based upon the circuit diagram illustrated in FIG. 5, voltage VX 154 PTAT (proportional to absolute temperature) behavior versus temperature is simulated. The simulation shows linear behavior from −40 to 120 degrees C. with voltage VX 154 equal to 30.8e-3 volts at −40 degrees C. and with voltage VX 154 equal to 50.9e-3 volts at 120 degrees C.

Figure 15:
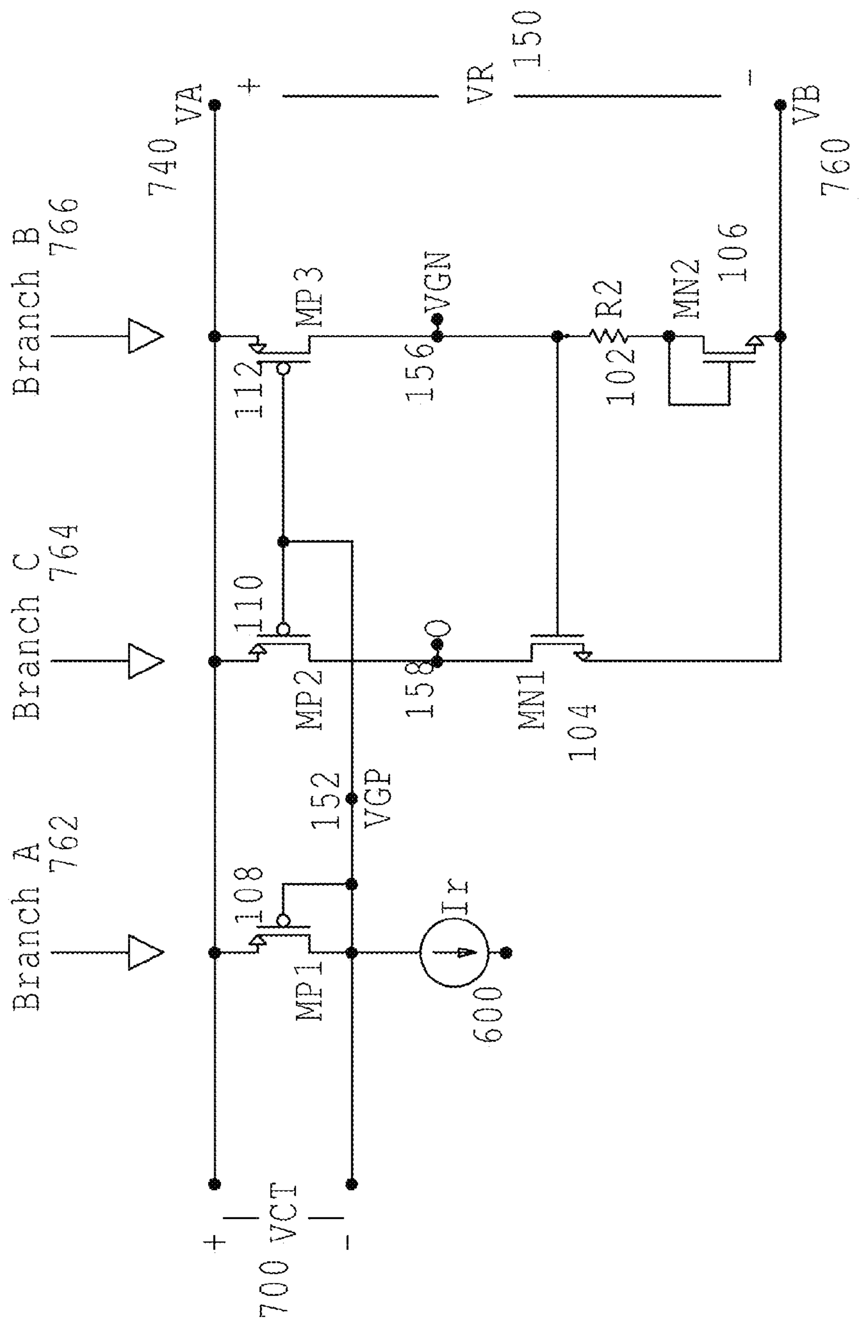
FIG. 15 illustrates an alternative embodiment for a comparator mode circuit diagram of the present invention.

FIG. 15 illustrates an alternative embodiment for a comparator mode circuit diagram of the present invention. In this configuration, the branch position of resistor R2 102 and NMOS MN2 106 are reversed. In theory, this circuit is equivalent to the circuit illustrated in FIG. 8 when the body of NMOS MN2 is connected to its source.

Figure 16:
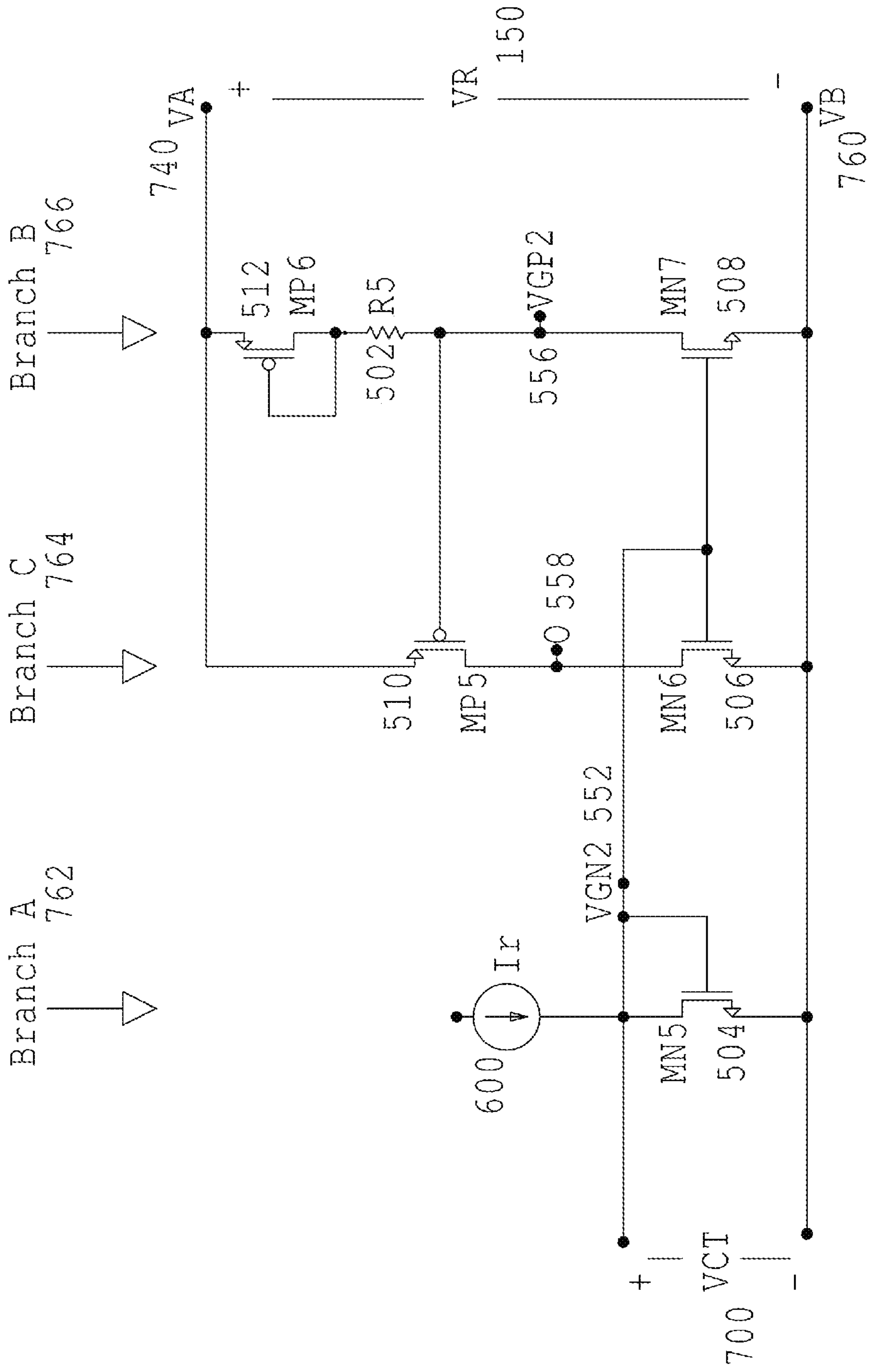
FIG. 16 illustrates an alternative embodiment for a comparator mode circuit where an equivalent approach for generating VGP2 in branch B is implemented by reversing the order of the resistor R5 and MP6.

FIG. 16, likewise, is an equivalent embodiment of FIG. 10 with the circuit elements R5 502 and MP6 512 rearranged in branch B 766.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention. Furthermore, for the purpose of clarity and brevity, the following nomenclature can be used: in one case, a type-1 device can refer to a PMOS device and a type-2 device can refer to an NMOS device; in a second case, a type-1 device can refer to an NMOS device and a type-2 device can refer to a PMOS device; and in other cases, a type-1 device can refer to a P-channel transistor and a type-2 device can refer to an N-channel transistor, or vice versa.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

I claim:

1. A temperature stable comparator circuit, comprised of:

a branch C having a first end, a second end, a first type-1 device and first type-2 device, wherein said first type-1 device and said first type-2 device are connected to a node O;

a branch B having a first end, a second end, a second type-1 device, a second type-2 device, and a resistor; and a branch A having a first end, a second end, a third type-2 device and a current-control device;

wherein said first ends of said branch A, branch B, and branch C are commonly connected, and said second ends of said branch B and branch C are commonly connected;

wherein said third type-2 device is diode-connected having a first terminal and a second terminal and having a VCT voltage across the first and second terminals, wherein said second terminal is connected to the first end of the branch A, and said first terminal is connected to the first type-2 device and the second type-2 device;

wherein said second type-1 device is diode-connected and is connected to said first type-1 device;

wherein the current in the branches are proportional to absolute temperature (PTAT); and wherein the current in branch A is proportional to the voltage VR.

2. The circuit of claim 1 where the current-control device is connected to the second end of branch C.

3. The circuit of claim 1 where the current of the current-control device increases with VR.

4. The circuit of claim 1 wherein said first end and second end of branch B receiving an input voltage VR and an output is generated at the node O.

5. The circuit of claim 4 wherein said second type-1 device and said type-2 device are connected to a node VG; wherein the voltages at said node VG and node O are used to drive a feedback circuit to provide a stable VR voltage that is temperature stable.

6. The circuit of claim 4 wherein in said branch B said second type-1 device and said resistor are connected to a node VG; wherein the voltages at said node VG and node O are used to drive a feedback circuit to provide a stable VR voltage that is temperature stable.

7. The circuit of claim 1 wherein the type-1 devices are N-type MOSFETs and the type-2 devices are P-type MOSFETs.

8. The circuit of claim 2 where the current-control device is a resistor.

9. The circuit of claim 8 wherein the type-1 devices are N-type MOSFETs and the type-2 devices are P-type MOSFETs.

10. The circuit of claim 1 wherein the type-1 devices are P-type MOSFETs and the type-2 devices are N-type MOSFETs.

11. A temperature stable comparator circuit, comprised of:

a branch C having a first end, a second end, a first type-1 device and first type-2 device, wherein said first type-1 device and said first type-2 device are connected to a node O;

a branch B having a first end, a second end, a second type-1 device, a second type-2 device, and a resistor; and a branch A having a first end, a second end, a third type-2 device and a current-control device;

wherein said first ends of said branch A, branch B, and branch C are commonly connected, and said second ends of said branch B and branch C are commonly connected;

wherein said third type-2 device is diode-connected having a first terminal and a second terminal and having a VCT voltage across the first and second terminals, wherein said second terminal is connected to the first end of the branch A, and said first terminal is connected to the first type-2 device and the second type-2 device;

wherein said second type-1 device is diode-connected and is connected to said first type-1 device;

wherein the current in the branches are proportional to absolute temperature (PTAT);

wherein the current in branch A is proportional to the voltage VR; and wherein the type-1 devices are N-type MOSFETs and the type-2 devices are P-type MOSFETs.

12. The circuit of claim 11 where the current-control device is connected to the second end of branch C.

13. The circuit of claim 11 where the current of the current-control device increases with VR.

14. The circuit of claim 11 wherein said first end and second end of branch B receiving an input voltage VR and an output is generated at the node O.

15. The circuit of claim 14 wherein said second type-1 device and said type-2 device are connected at a node VG; wherein the voltages at said node VG and node O are used to drive a feedback circuit to provide a stable VR voltage that is temperature stable.

16. The circuit of claim 14 wherein in said branch B said second type-1 device and said resistor are connected to a node VG; wherein the voltages at said node VG and node O are used to drive a feedback circuit to provide a stable VR voltage that is temperature stable.

17. The circuit of claim 12 where the current-control device is a resistor.

18. A temperature stable comparator circuit, comprised of:

a branch C having a first end, a second end, a first type-1 device and first type-2 device, wherein said first type-1 device and said first type-2 device are connected to a node O;

a branch B having a first end, a second end, a second type-1 device, a second type-2 device, and a resistor; and a branch A having a first end, a second end, a third type-2 device and a current-control device;

wherein said first ends of said branch A, branch B, and branch C are commonly connected, and said second ends of said branch B and branch C are commonly connected;

wherein said third type-2 device is diode-connected having a first terminal and a second terminal and having a VCT voltage across the first and second terminals, wherein said second terminal is connected to the first end of the branch A, and said first terminal is connected to the first type-2 device and the second type-2 device;

wherein said second type-1 device is diode-connected and is connected to said first type-1 device;

wherein the current in the branches are proportional to absolute temperature (PTAT);

wherein the current in branch A is proportional to the voltage VR; and wherein the type-1 devices are P-type MOSFETs and the type-2 devices are N-type MOSFETs.

19. The circuit of claim 18 where the current-control device is connected to the second end of branch C.

20. The circuit of claim 18 where the current of the current-control device increases with VR.

21. The circuit of claim 18 wherein said first end and second end of branch B receiving an input voltage VR and an output is generated at the node O.

22. The circuit of claim 21 wherein said second type-1 device and said type-2 device are connected at a node VG; wherein the voltages at said node VG and node O are used to drive a feedback circuit to provide a stable VR voltage that is temperature stable.

23. The circuit of claim 21 wherein in said branch B said second type-1 device and said resistor are connected to a node VG; wherein the voltages at said node VG and node O are used to drive a feedback circuit to provide a stable VR voltage that is temperature stable.

24. The circuit of claim 19 where the current-control device is a resistor.

* * * * *